United States Patent
Cho

(10) Patent No.: US 7,977,749 B2
(45) Date of Patent: Jul. 12, 2011

(54) SEMICONDUCTOR DEVICE WITH INCREASED CHANNEL AREA

(75) Inventor: Jun-Hee Cho, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/648,227

(22) Filed: Dec. 28, 2009

(65) Prior Publication Data

US 2010/0096690 A1    Apr. 22, 2010

Related U.S. Application Data

(62) Division of application No. 11/617,500, filed on Dec. 28, 2006, now Pat. No. 7,638,398.

(30) Foreign Application Priority Data

Mar. 31, 2006 (KR) .............................. 2006-0029870
Dec. 8, 2006 (KR) .............................. 2006-0124736

(51) Int. Cl.
*H01L 29/786* (2006.01)
*H01L 29/80* (2006.01)

(52) U.S. Cl. ........ 257/349; 257/259; 257/262; 257/270; 257/332; 257/E21.662; 257/E21.667; 257/E27.067; 257/E29.242; 257/E29.255; 438/197; 438/272; 438/280; 438/284; 438/294; 438/296

(58) Field of Classification Search .................. 257/259, 257/262, 270, 332, 349, E21.662, E21.667, 257/E27.067, E29.242, E29.255; 438/197, 438/272, 280, 284, 294, 296
See application file for complete search history.

(56) References Cited

U.S. PATENT DOCUMENTS

| 5,804,848 | A | 9/1998 | Mukai |
| 6,794,699 | B2 | 9/2004 | Bissy et al. |
| 7,101,763 | B1 | 9/2006 | Anderson et al. |
| 7,390,701 | B2 | 6/2008 | Cheng et al. |
| 7,456,476 | B2 * | 11/2008 | Hareland et al. .............. 257/349 |
| 2005/0142700 | A1 | 6/2005 | Cheng et al. |

FOREIGN PATENT DOCUMENTS

| CN | 1577850 | 2/2005 |
| JP | 05-218415 | 8/1993 |
| JP | 05-218416 | 8/1993 |
| TW | I241718 | 10/2005 |

\* cited by examiner

*Primary Examiner* — Dao H Nguyen

(74) *Attorney, Agent, or Firm* — Kilpatrick Townsend & Stockton LLP

(57) ABSTRACT

A semiconductor device includes an active region defining at least four surfaces, the four surfaces including first, second, third, and fourth surfaces, a gate insulation layer formed around the four surfaces of the active region, and a gate electrode formed around the gate insulation layer and the four surfaces of the active region.

3 Claims, 8 Drawing Sheets

SEMICONDUCTOR DEVICE WITH INCREASED CHANNEL AREA

CROSS-REFERENCES TO RELATED APPLICATIONS

The present invention is a divisional of U.S. patent application Ser. No. 11/617,500, filed on Dec. 28, 2006, and claims priority of Korean patent application numbers 10-2006-0029870 and 10-2006-0124736, filed on Mar. 31, 2006 and Dec. 8, 2006, respectively, which are incorporated by reference in their entirety.

BACKGROUND OF THE INVENTION

The present invention relates to a semiconductor device and more particularly, to a fabrication method for a semiconductor device with an increased channel area and a fabrication method thereof.

In general, for semiconductor devices, as miniaturization has decreased the design rule, the concentration of boron in the channel regions has increased, leading to an increase in the electric field. This is especially true for dynamic random access memory (DRAM) cell and planar type N-channel metal-oxide semiconductor field effect transistors (NMOS-FETs). As a result, it is often difficult to obtain an acceptable refresh time.

Due to large scale of integration of semiconductor devices (e.g., DRAMs), feature size tends to decrease while doping concentration tends to increase. This increase causes the electric field of the semiconductor device to increase. The increase in the electric field, however, also increases junction leakage.

Also, since channel lengths and widths are often constrained, channel doping is increasingly applied to meet the required technical features. As a result, mobility of electrons is likely to decrease. This decrease in mobility makes it difficult to obtain the required current flow through channels.

FIG. 1A illustrates a top view of a semiconductor device with a conventional planar NMOSFET. FIG. 1B illustrates a sectional view of the semiconductor device taken from cut plane A-A' illustrated in FIG. 1A. A shallow trench isolation (STI) process is performed on a region of substrate 11 to form an isolation structure 12 (e.g., field oxide layer). A gate oxide layer 13 is formed on an active region 11A of the substrate 11 defined by the isolation structure 12. Planar type gates PG each including a gate electrode 14 and a gate hard mask 15 stacked over each other in this sequence order are formed on the gate oxide layer 13. Within the active region 11A, N-type source and drain regions S and D are formed on both sides of each of the planar type gates PG.

As illustrated and described above, since the planar type gates PG are formed on the flat surface of the active region 11A of the substrate 11, they are often called NMOSFETs with planar channels. However, due to large scale integration, the planar type transistor structure often has difficulty in obtaining the desired channel length and width. Thus, a short (or narrow) channel effect may not be blocked.

Recess channel array transistors (RCATs) or FinFETs are suggested to overcome the above limitation. Although these suggested transistor structures are capable of increasing the channel area by using three surfaces of the active region, these structures may not be enough to increase the channel area up to a certain level due to the high integration.

SUMMARY OF THE INVENTION

Specific embodiments of the present invention provide a method of fabricating a semiconductor device capable of maximizing the channel area and a fabrication method thereof.

In accordance with one aspect of the present invention a semiconductor device is provided which includes: a 3-dimensional active region including a top, two sides and a bottom surface; a gate insulation layer formed over the top, two sides and bottom surface of the active region; and gate electrodes formed over the gate insulation layer which encircles the active region.

In accordance with another aspect of the present invention, there is provided a method for fabricating a semiconductor device, including: forming trenches in a substrate, the trenches defining an active region of the substrate; etching the substrate underneath the trenches to form first recesses connecting the trenches in one direction and providing a pillar supporting the active region; forming an isolation structure simultaneously filling the first recesses and the trenches; etching parts of the substrate and isolation structure to form second recesses exposing a top surface, two side surfaces and a bottom surface of the active region; forming a gate insulation layer over the exposed top, sides and bottom surface of the active region; and forming gate electrodes over the gate insulation layer to encircle the active region.

In one embodiment, a method for fabricating a semiconductor device includes forming an active region on a substrate, the active region having first, second, third, an fourth surfaces that define first, second, third, and fourth channels. A gate insulation layer is formed around the active region to insulate the first, second, third, and fourth surfaces. A gate electrode is formed around the gate insulation layer and the first, second, third, and fourth surfaces of the active region. The gate electrode is configured to control currents flowing in the first, second, third, and fourth channels. The first, second, third, and fourth surfaces of the active regions are connected to define a substantially polygonal-shaped structure. The corners of the polygonal-shape may be rounded.

DESCRIPTION OF SPECIFIC EMBODIMENTS

Figure 1A:
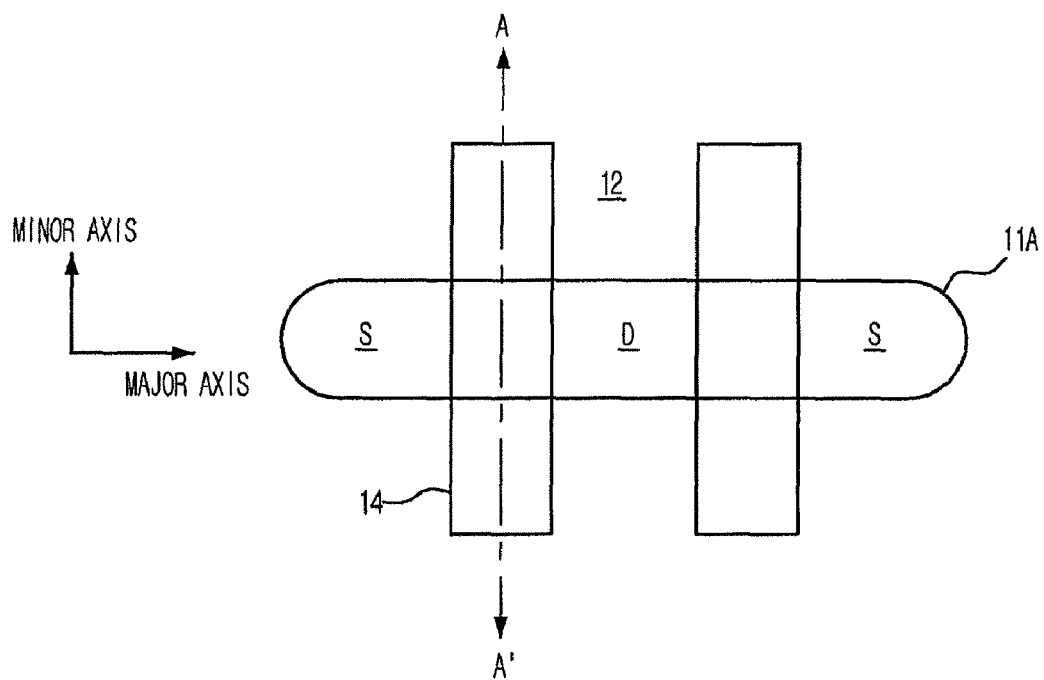
FIG. 1A illustrates a top view of a conventional planar type NMOSFET.
Figure 1B:
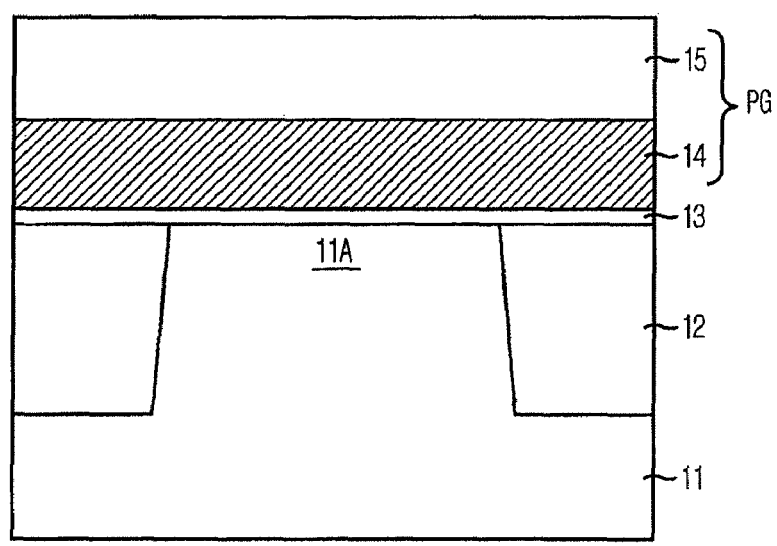
FIG. 1B illustrates a cross-sectional view of the semiconductor device taken along a line A-A' illustrated in FIG. 1A.
Figure 2A:
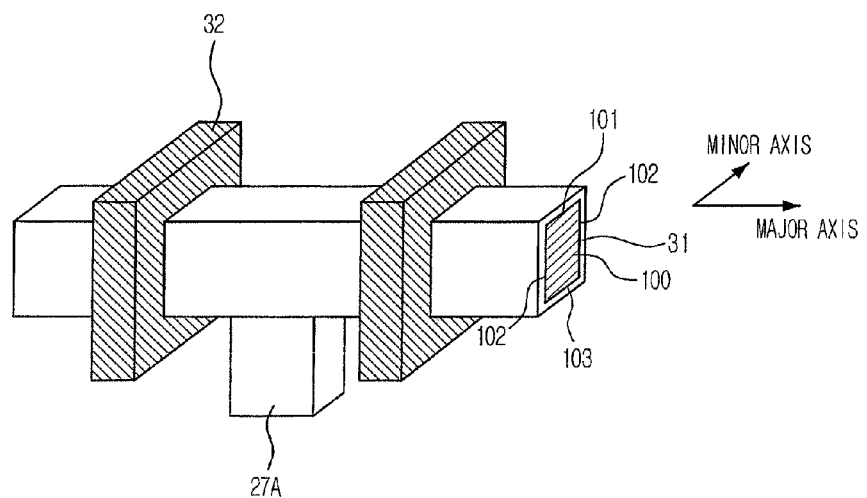
FIG. 2A illustrates a perspective view of a semiconductor device in accordance with an embodiment of the present invention.
Figure 2B:
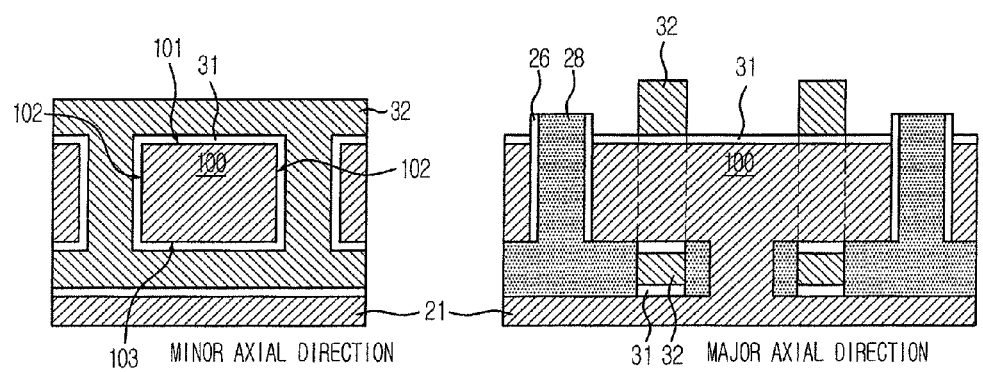
FIG. 2B illustrates cross-sectional views of the semiconductor device in accordance with an embodiment of the present invention.

FIG. 2A is a perspective view of a semiconductor device structure in accordance with an embodiment of the present invention. FIG. 2B illustrates cross-sectional views of the semiconductor device structure in accordance with an embodiment of the present invention. The semiconductor device structure is illustrated with major and minor axes. The active region 100 has four surfaces including a top surface 101, two side surfaces 102 and a bottom surface 103. Ring-type gate electrodes 32 are formed over the surfaces of the active region 100 as seen in FIG. 2A. The gate electrodes 32 include polysilicon.

A pillar 27A is formed in a central region of the active region 100, and supports the active region 100. There exist four channels since the gate electrodes 32 are formed in a ring-like shape, encompassing the four surfaces of the active region 100. The ring-like shape may have substantially angular corners or substantially rounded corners according to application.

FIG. 2B shows cross sectional views with the cut plane in the minor and major axial direction. Reference numerals 21, 26, 28, and 31 denote a substrate, a spacer, an isolation structure (e.g., field oxide layer), and a gate insulation layer (e.g., oxide layer), respectively. The direction of the channels will be described in detail with reference to FIG. 4C later. According to the present embodiment, since the four surfaces of the active region 100 are used as the channels, the channel area of the semiconductor device can be increased to a greater extent as compared with the conventional RCATs and FinFETs.

FIGS. 3A to 3G are cross-sectional views illustrating a method for fabricating a semiconductor device in accordance with another embodiment of the present invention. The cross-sectional views on the left side in FIGS. 3A to 3F use a cut plane along the minor axial direction of the active region 300, while those on the right side use a cut plane along the major axial direction of the active region 300.

Figure 3A:
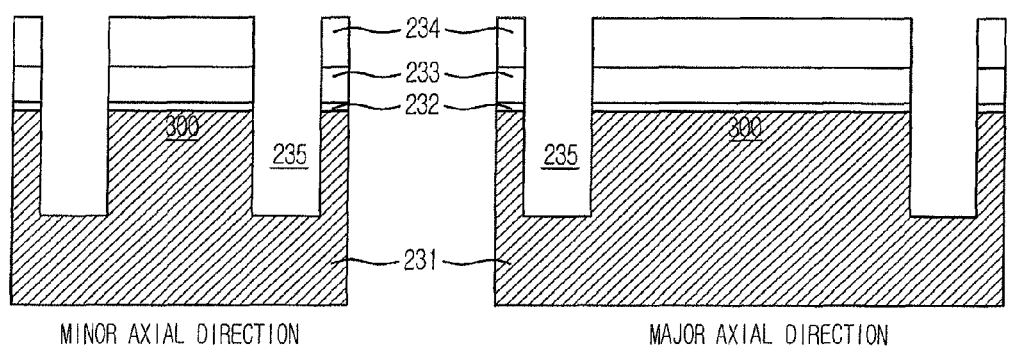
FIGS. 3A to 3G are cross-sectional views to illustrate a method for fabricating a semiconductor device in accordance with another embodiment of the present invention.

Referring to FIG. 3A, a pad oxide layer 232 and a pad nitride layer 233 are formed over a substrate 231. The substrate 231 includes a silicon-based substrate including a certain amount of impurity. The pad oxide layer 232 is formed to a thickness of about 50 Å to 150 Å, and the pad nitride layer 233 is formed to a thickness of about 1,000 Å to 2,000 Å.

A photoresist layer is coated over the pad nitride layer 233 and patterned through a photolithography process to form a STI mask 234. The photoresist layer includes a polymer-based material including cycloolefin-maleic anhydride (COMA) or acrylate. The STI mask 234 is formed in a bar-type or 'T'-type when viewed from top. Although not illustrated, prior to forming the STI mask 234, an anti-reflective coating layer is formed to prevent a scattering effect during the photolithography process. The anti-reflective coating layer may include a SiON-based material.

The pad nitride layer 233 and the pad oxide layer 232 are etched using the STI mask 234 as an etch mask and substrate 231 is etched to a certain depth. As a result, trenches 235 are formed for isolation. The depth of each of the trenches 235 ranges from about 1,000 Å to 2,000 Å in consideration of subsequent wet etching and oxidation. The trenches 235 are to be regions for an isolation structure, and define an active region 300.

Figure 3B:
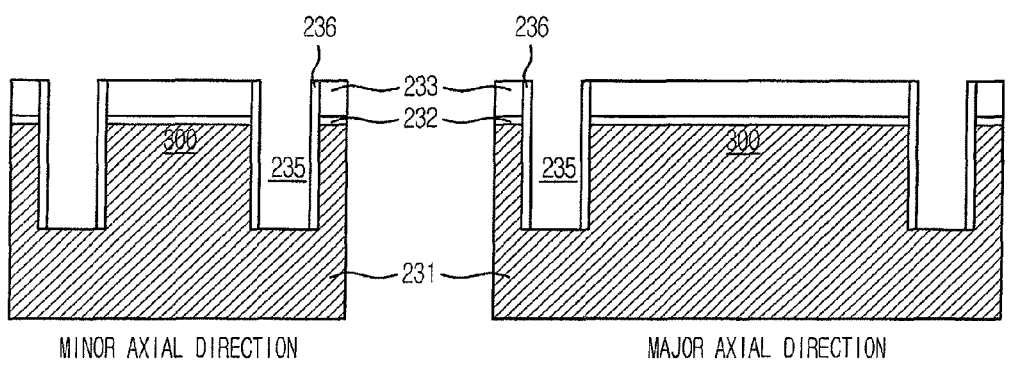

Referring to FIG. 3B, the STI mask 234 is removed using oxygen plasma. Spacers 236 are formed over both sidewalls of the trenches 235 and the stack pattern structure including the pad oxide layer 232 and the pad nitride layer 233. The spacers 236 are formed by depositing a nitride-based layer (not shown) over the resultant structure illustrated in FIG. 3A and performing an etch-back process thereon.

Figure 3C:
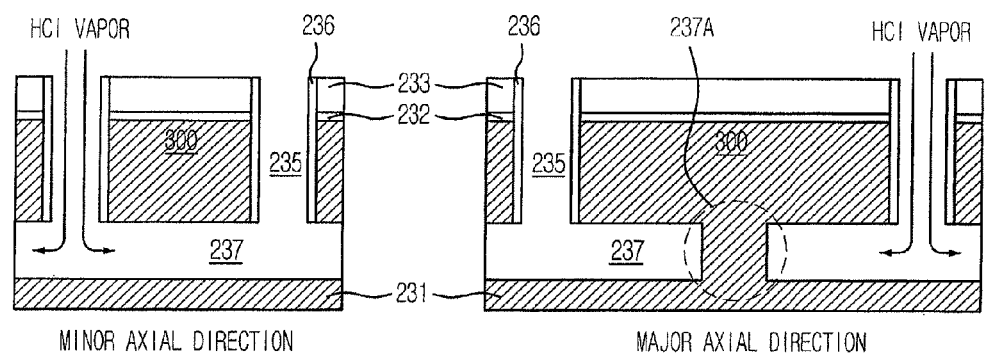

Referring to FIG. 3C, an isotropic etching is performed using the spacers 236 as an etch mask. Hydrogen chloride (HCl) vapor is used to perform the etching. As a result of this isotropic etching, first recesses 237 (or horizontal tunnel) are formed extending laterally underneath the trenches 235. When viewed from the major axial direction, the first recesses 237 are under-cut from the bottom portions of the respective trenches 235.

The active region 300 is shorter in the minor axial direction than in the major direction. This fact is important because the two trenches 235 in the minor axial direction are close enough to allow the isotropic etching to connect the two. The trenches 235 in the major axial direction are far enough to allow a pillar 237A of the substrate 231 to remain in the center. As a result, the active region 300 does not collapse.

The isotropic etching is performed maintaining a pressure of about 2 Torr to 200 Torr and flowing the HCl vapor at about 100 sccm to 1,000 sccm for adjustment of an etch rate and profile. When the HCl vapor is used, the isotropic etching is performed at a temperature of about 700° C. to 1,000° C. for about 30 seconds to 60 seconds.

Prior to the isotropic etching using the HCl vapor, a pre-annealing treatment is performed in an atmosphere of hydrogen at a temperature ranging from about 800° C. to 1,000° C. The pre-annealing treatment is performed to remove foreign materials.

Figure 3D:
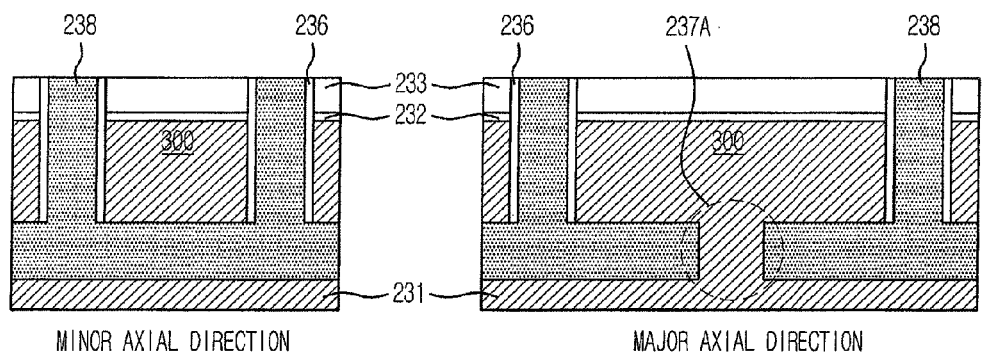

Referring to FIG. 3D, a gap-filling insulation layer fills the first recesses 237 and the trenches 235, and a chemical mechanical polishing is performed to form an isolation structure 238 (e.g., a field oxide layer). The gap-filling insulation layer includes an oxide-based material. The STI CMP process is well known in the art, and the polishing stops at the pad nitride layer 233. The gap-filling insulation layer fills the first recesses 237 and the trenches 235 by simultaneous deposition. Alternatively, a thermal oxidation treatment may be performed on the gap-filling insulation layer to fill the first recesses 237, and then, a high density plasma (HDP) treatment may be performed to fill the trenches 235.

Figure 3E:
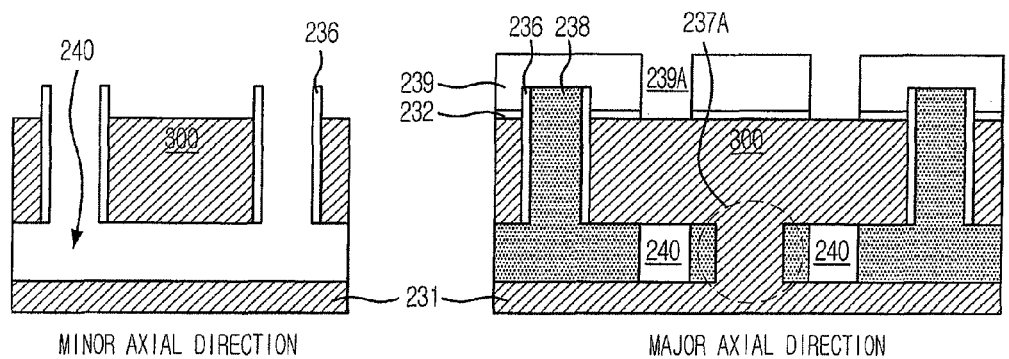

Referring to FIG. 3E, the pad nitride layer 233 is selectively removed using a solution of phosphoric acid ($H_3PO_4$). A photoresist layer is coated over the remaining pad oxide layer 232 and patterned through photolithography to form a photoresist pattern 239. The photoresist pattern 239 includes a polymer-based material such as COMA or acrylate. The photoresist pattern 239 is not formed over the remaining pad oxide layer 232 in the minor axial direction.

Those open regions 239A opened by the photoresist pattern 239 are formed in a line pattern. These regions are where subsequent gates are to be formed. Therefore, due to the open regions 239A, a portion of the active region 300 and a portion of the pad oxide layer 232 are exposed in the line pattern in the major axial direction, while the isolation structure 238, the pad oxide layer 232 and the entire portion of the active region 300 are exposed in the minor axial direction. Herein, the entire region of the active region 300 is the active region 300 only in the minor axial direction.

The pad oxide layer 232 is etched using the photoresist pattern 239 as an etch mask. The isolation structure 238 exposed after the etching of the pad oxide layer 232 is etched to form second recesses 240 for channel formation. In the minor axial direction, the pad oxide layer 232 and the isolation structure 238 are etched away. For etching downward, a dry etching is performed until reaching the bottom of the first recesses 237 (see FIG. 3C), and a wet etching is performed additionally for the lateral etching. Therefore, etching the pad oxide layer 232 and the isolation structure 238 using the photoresist pattern 239 allows the formation of the second recesses 240. The second recesses 240 encompass (or wraps around) the active region 300 in a ring.

Figure 3F:
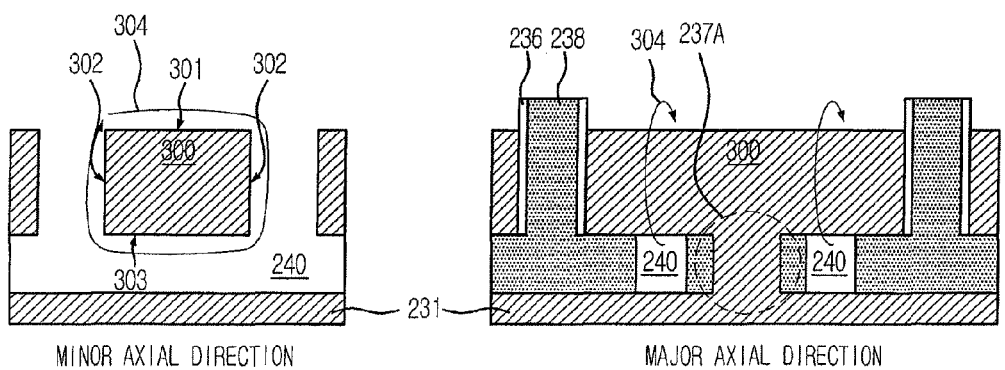

Referring to FIG. 3F, the spacers 236 in the second recess 240 are removed. Since the spacers 236 include a nitride-based material, $H_3PO_4$ solution is used for the removal. The photoresist pattern 239 is removed, and then, the pad oxide layer 232 remaining over the active region 300 in the major axial direction is removed.

After the removal of the pad oxide layer 232, the four sides of the channel 301,302,303,304 are exposed in one completed circular loop 304.

Figure 3G:
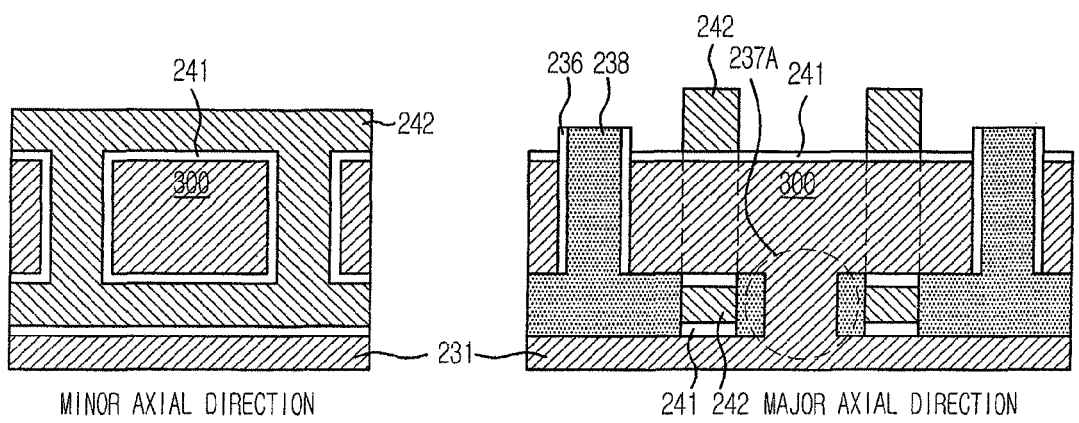

Referring to FIG. 3G, a gate insulation layer 241 is formed over the active region 300 exposed after the removal of the pad oxide layer 232. The gate insulation layer 241 includes an oxide-based material, and is formed by performing a thermal oxidation treatment or a deposition method. More specifically, the thermal treatment is performed to make the gate insulation layer 241 grow over the exposed surfaces of the active region 300 with a uniform thickness.

A polysilicon layer serving as a gate electrode of a transistor is formed over the gate insulation layer 241 till filling the second recesses 240. Although not illustrated, a metal-based layer having low resistance and a hard mask layer are formed over the polysilicon layer 242 and patterned to form gate patterns. The metal-based layer and the hard mask layer may also include tungsten and a nitride-based material, respectively. Since the gate electrodes 242 encompass the four exposed surfaces of the active region 300 like a ring, four channels are formed.

Figure 4A:
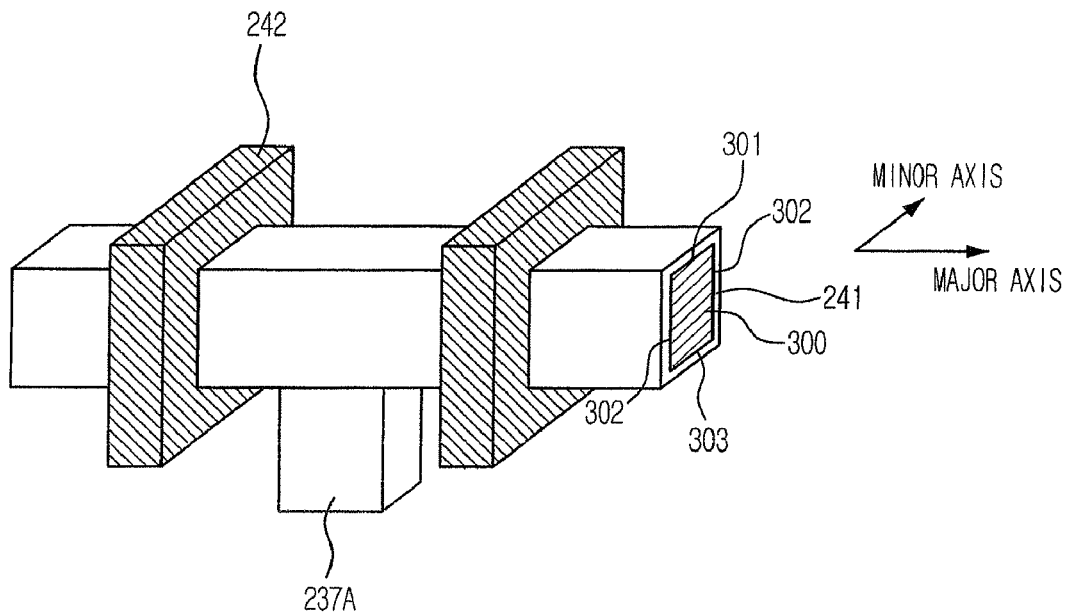
FIG. 4A illustrates a perspective view of the semiconductor device structure in accordance with another embodiment of the present invention.

FIG. 4A illustrates a perspective view of the semiconductor device structure obtained in accordance with the other embodiment of the present invention. In particular, FIG. 4A illustrates the structural configuration among the active region 300 and the gate electrodes (e.g., the polysilicon layer 242). The active region 300 includes the four exposed surfaces, i.e., the top surface 301, the two side surfaces 302 and the bottom surface 303. The gate electrodes 242 are formed in a ring-like shape encompassing the four surfaces of the active region 300. FIG. 4A shows two gate electrodes, one on each side of the pillar 237A. A single gate electrode wraps around the four sides of the active region 300.

In a central region of the active region 300, the pillar 237A exists, and the gate electrodes 242 encompass the exposed surfaces of the active region 300 on both sides of the pillar 237A. Since the gate electrodes 242 encompass the four exposed surfaces of the active region 300 as like a ring, four channels are formed.

Figure 4B:
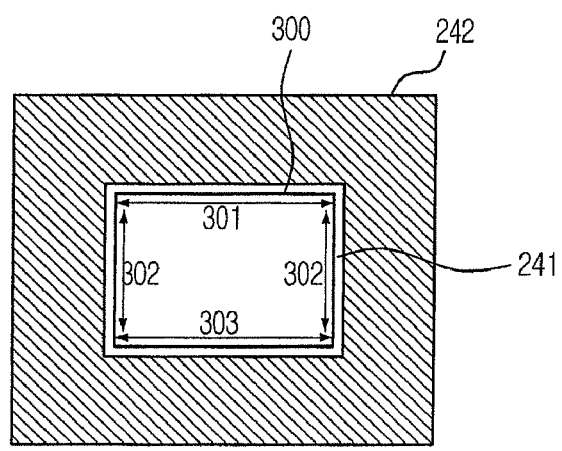
FIG. 4B is a diagram illustrating a contact region between an active region and a gate electrode (e.g., polysilicon-based gate electrode) in accordance with another embodiment of the present invention.
Figure 4C:
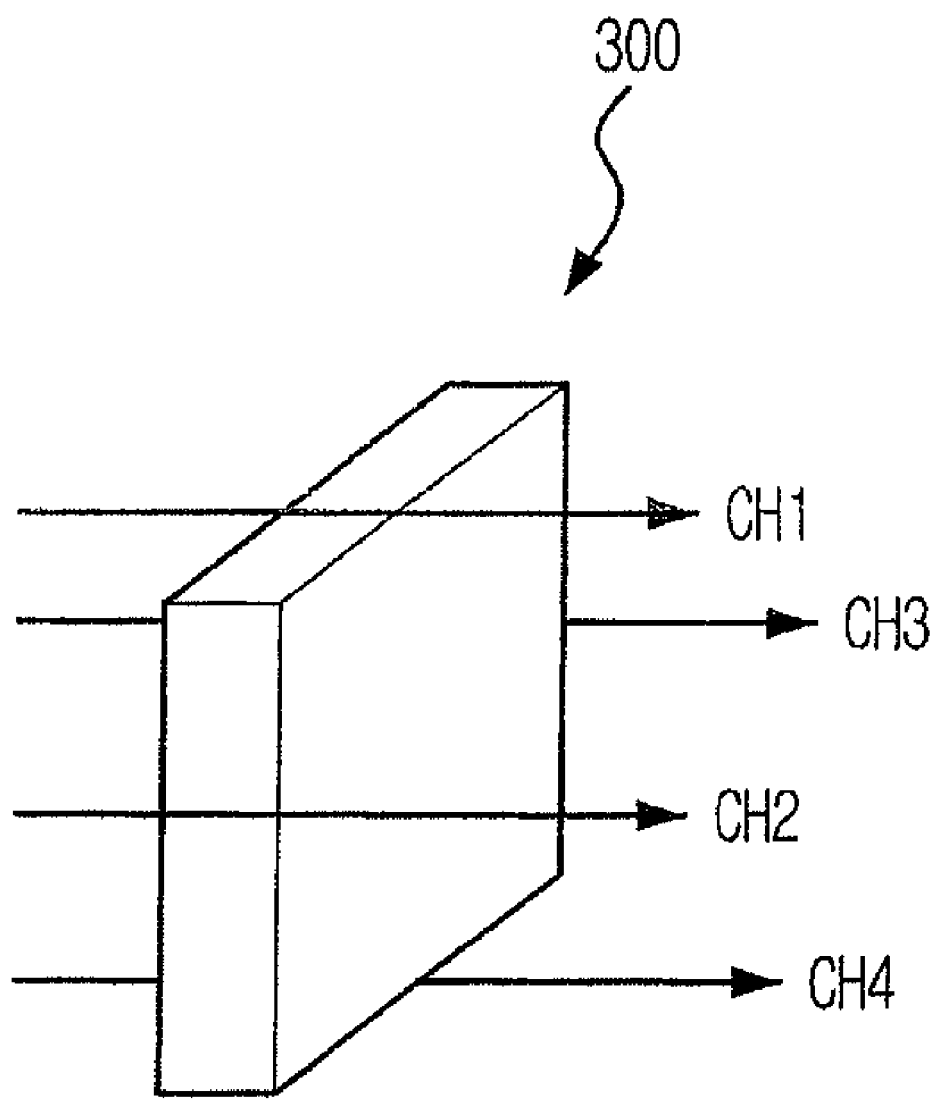
FIG. 4C is a diagram illustrating various directions of channels formed in the active region in accordance with another embodiment of the present invention.

FIG. 4B is a diagram illustrating the contact surface between the gate electrode 242 and the active region 300 in accordance with another embodiment of the present invention. FIG. 4C is a diagram illustrating various directions of the four channels formed in the active region in accordance with another embodiment of the present invention. Referring to FIG. 4B, since the gate electrode 242 encompass the top surface 301, the two side surfaces 302 and the bottom surface 303 of the active region 300 in the form of a ring, the four channels are formed as described in FIG. 4A. In more detail, as illustrated in FIG. 4C, a first channel CH1 is formed on the top surface 301 of the active region 300. Second and third channels CH2 and CH3 are formed on the side of the two side surfaces 302 of the active region 300. A fourth channel CH4 is formed on the bottom surface 303 of the active region 300.

According to various embodiments of the present invention, since the given surfaces (e.g. four surfaces) of the active region are used, the channel length and area can be maximized to a great extent as compared with the conventional RCATs and FinFETs. As a result, a short channel effect can be reduced when semiconductor devices are integrated to a great scale. Accordingly, transistor characteristics can be improved.

While the present invention has been described with respect to certain embodiments, it will be apparent to those skilled in the art that various changes and modifications may be made without departing from the spirit and scope of the invention as defined in the following claims.

What is claimed is:

1. A semiconductor device comprising:
    an active region defining at least four surfaces, the four surfaces including first, second, third, and fourth surfaces;
    a gate insulation layer formed around the four surfaces of the active region; and
    gate electrodes formed as ring-type surrounding the gate insulation layer and the four surfaces of the active region,
    wherein the active region is supported by a pillar supporting the active region between the gate electrodes.

2. The semiconductor device of claim 1, wherein at least one of the gate electrodes includes two horizontal portions and two vertical portions defined between the two horizontal portions.

3. The semiconductor device of claim 2, wherein the active region has major and minor axes; and at least one of the gate electrodes encompasses a portion of the active region in the minor axial direction.

* * * * *